United States Patent [19]

Shinozaki

[11] 3,934,158

[45] Jan. 20, 1976

[54] SWITCHING CIRCUIT

[75] Inventor: Masanobu Shinozaki, Yokohama, Japan

[73] Assignee: Victor Company of Japan, Limited, Japan

[22] Filed: Feb. 27, 1974

[21] Appl. No.: 446,320

[30] Foreign Application Priority Data

Mar. 3, 1973 Japan .............................. 48-25562

[52] U.S. Cl. ................ 307/239; 307/202; 307/254

[51] Int. Cl.$^2$ ......................................... H03K 17/00

[58] Field of Search .................. 307/202, 239, 254; 330/207 P; 317/9 R, 9 A, 9 D, 33 R, 33 C, 36 TD; 325/478

[56] References Cited

UNITED STATES PATENTS

| | | | |
|---|---|---|---|
| 3,551,746 | 12/1970 | Rubner | 317/33 R |
| 3,564,338 | 2/1971 | Toshihiko et al. | 317/33 R |
| 3,731,153 | 5/1973 | Nishimoto | 330/207 P |
| 3,835,412 | 9/1974 | Honda et al. | 317/33 R |

*Primary Examiner*—John S. Heyman
*Assistant Examiner*—B. P. Davis
*Attorney, Agent, or Firm*—Robert E. Burns; Emmanuel J. Lobato; Bruce L. Adams

[57] ABSTRACT

An improved switching means is provided in a loudspeaker system, which includes a power amplifier of direct coupled type having no output condensor to deliver an audio-frequency current to the loudspeaker, to eliminate undesirable effects by rapidly breaking an electrical connection between the power amplifier and the loudspeaker upon cutting off an a.c. power source. The switching means comprises circuitry having a remarkably short "time constant" compared with another circuitry provided outside the switching means but within the loudspeaker system, so that the abovementioned rapid breaking is accomplished.

6 Claims, 4 Drawing Figures

SWITCHING CIRCUIT

BACKGROUND OF THE INVENTION

This invention relates generally to a switching circuit and particularly to a switching circuit for rapidly breaking an electrical connection between a power amplifier and a loudspeaker upon cutting off an a-c power source.

Various amplifiers of direct-coupled type having no output condensor find extensive use in audio-frequency power amplifiers and other applications. In such audio-frequency power amplifiers, there is sometimes employed an a-c power source, from which a suitable d-c power is obtained through rectifying and filtering means and then fed to the amplifier. However, in the above case of making use of the a-c power source, some disadvantages are encountered as described below. When the a-c power supply is cut off, there is unwanted noise from a loudspeaker connected to the amplifier, which is generated by a direct voltage arising from an unbalance of direct current in the amplifier. Furthermore, when conditions are at the worst, there is a fear that the loudspeaker suffers irrecoverably from the excessive direct current flowing through its voice coil due to the above-mentioned unbalance. Therefore, there have heretofore developed several protecting circuits of the loudspeaker from such undesirable conditions. Each of the prior art for the purpose gain success in preventing the loudspeaker from being destroyed, whereas it is not sufficient to eliminate the noise from the loudspeaker, in that it can not respond quick to the cut-off of the a-c power source.

SUMMARY OF THE INVENTION

An object of the present invention, therefore, is to provide an improved switching circuit for use with a transistor amplifier of the direct-coupled type having no output condensor to rapidly break a connection between the power amplifier and a loudspeaker upon cutting off an a-c power source, whereby the loudspeaker is prevented from generating unwanted noise and being destroyed.

In the present invention, there is provided an improved switching circuit to rapidly break the connection between a power amplifier and a loudspeaker upon cutting off an a-c power source. First rectifying means is provided for converting a-c voltage to a first rectified d-c voltage. First filtering means is connected to the first rectifying means and derives the first rectified voltage therefrom for smoothing ripple variations thereof and then the first smoothed voltage is supplied to the power amplifier. To the first filtering means is connected a relay control transistor which is supplied with a first preset potential therefrom to remain conductive when the power switch is closed. A relay is connected to the relay control transistor and is controlled to make the connection when the transistor remains conductive. In relation to the first smoothed voltage, its transition time is considerable to decrease below the first preset potential upon cutting off the a-c power source. An improved switching means is connected to the relay control transistor. The switching means includes a circuit with a considerably short "time constant" in comparison with the transition time upon cutting off the a-c power source. The switching means is arranged to control the first preset potential to maintain it constant while the power switch is closed, and on the other hand to rapidly decrease the first preset potential upon cutting off the a-c power source, which is achieved by the above-mentioned short time constant, so that the relay control transistor is rendered non-conductive to rapidly break the connection between the amplifier and the loudspeaker.

BRIEF DESCRIPTION OF THE DRAWINGS

These and other objects, features and many of the attendant advantages of this invention will be appreciated more readily as the same becomes better understood by reference to the following detailed description, when considered in connection with the accompanying drawings, wherein like parts in each of the several figures are identified by the same reference characters, and wherein.

DESCRIPTION OF THE PREFERRED EMBODIMENT

Figure 1:
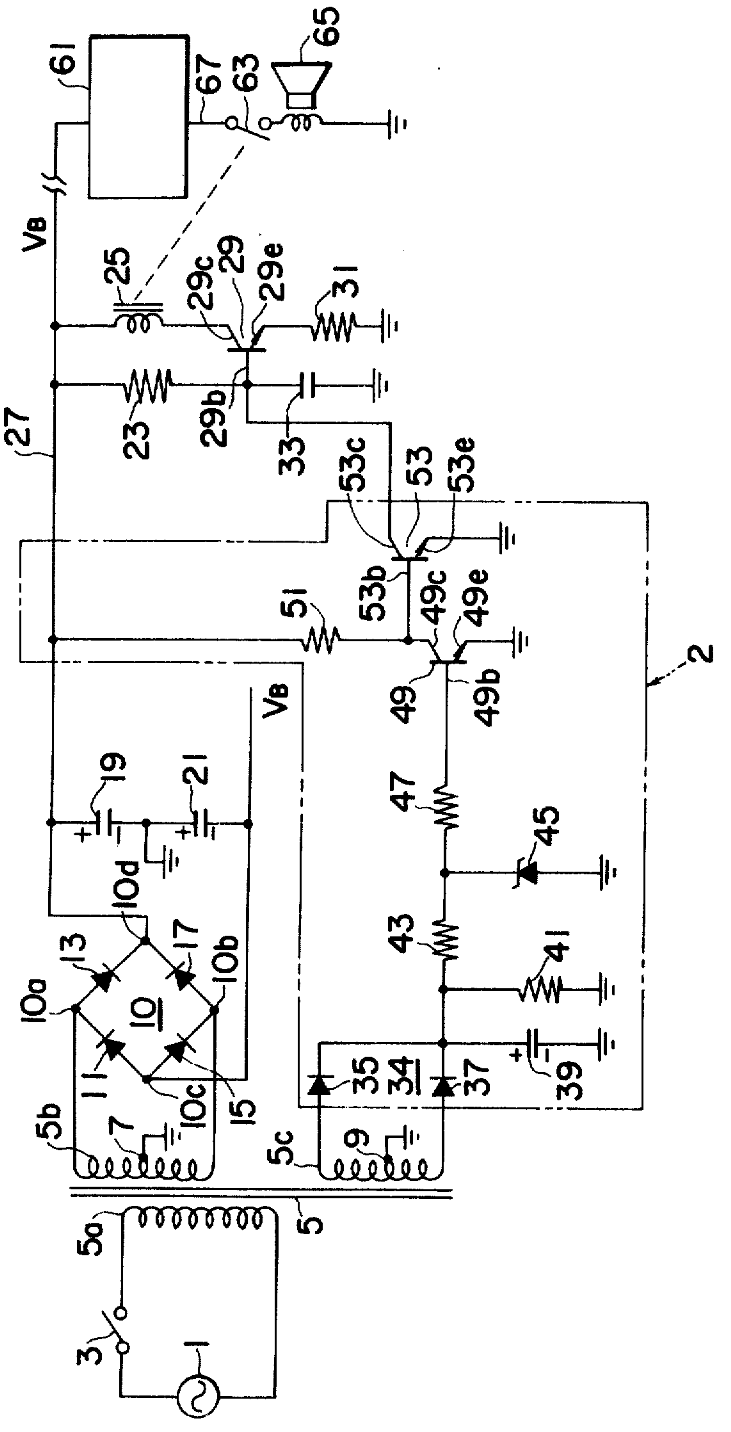
FIG. 1 is a circuit diagram illustrating a switching circuit in accordance with the present invention together with a conventional circuit employed therewith.
Figure 2:
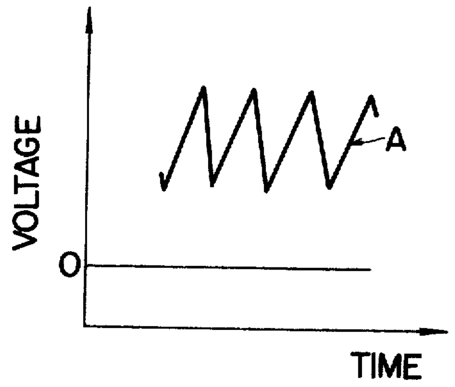
FIGS. 2 and 3 roughly illustrate waveforms of two kinds of voltages appearing in the switching circuit in accordance with the present invention for clarity of explanation.
Figure 3:
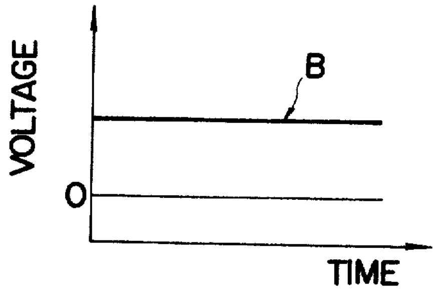

Reference is now made to FIGS. 1 through 3. In FIG. 1 there is illustrated a switching circuit in accordance with the present invention together with a conventional circuit arrangement employed therewith. A primary winding 5*a* of a transformer 5 is connected to an a-c power source through a power switch 3 for deriving the a-c power therefrom. The transformer 5 is a conventional one and a secondary winding 5*b* thereof is connected to a bridge type full-wave rectifier 10, which has four diodes 11, 13, 15 and 17 in series in a bridge circuit. The alternating voltage is applied to one pair of opposite junctions 10*a* and 10*b*, and direct voltage is obtained from the other pair of junctions 10*c* and 10*d*. It is to be noted that the rectifier is not restricted to the bridge-type of full-wave rectifier, but any other suitable rectifier can be available regardless of full or half-wave. The pulsating voltage developed by the rectifier output is fed across serially coupled capacitors 19 and 21, which are arranged in parallel with respect to the rectifier 10. As seen from the drawing, a junction between the capacitors 19 and 21 is grounded. The supplied pulsating voltage is smoothed into a steady d-c voltage suitable for applying to a power amplifier 61. The capacitors 19 and 21 each has a considerably large capacitance, for example, 4700 microfarads, so that it is understood that the smoothed voltage has a considerably large transition time to become a steady state upon cutting off the power switch 3. The power amplifier 61, as is explained at the outset, is of direct-coupled type having no output capacitor to deliver a voice current to a loudspeaker 65 connected thereto. A next stage is a relay-control transistor 29, the collector 29*c* of which is connected through a relay 25 to a bus line 27 extending from the filter means consisting of the capacitors 19 and 21. The relay 25 is provided to make complete a connection 67 between the power amplifier 61 and the loudspeaker 65 only while energized. The base 29*b* of the relay-control transistor 29 is connected by way of a resistor 23 to the bus line 27 and supplied with a preset potential therefrom such that the transistor 29 remains conductive while the power switch 3 is closed. It is assumed that a transistor 53, which is connected to the base 29*b* of the transistor 29 by its collector 53*c*, is non-conductive while the power switch 3 is closed, so that the preset potential appearing at the base 29*b* is maintained during the closed time of the power switch 3. With the circuit arrangement described above, that is, the FIG. 1 circuit in the absence of a circuit enclosed by a dotted line, provided that the power switch is opened, there is a fear that the loudspeaker 65 generates noise or might be damaged upon opening the power switch 3 due to the loss of the direct current balance in the amplifier 61, which results from the aforementioned large transition time of the smoothed voltage due to the capacitors 19 and 21 with such large capacitances. However, this undesirable occurrence will be avoided by making use of a switching circuit denoted by numeral 2, which operation is described hereinafter. An another secondary winding 5*c* with a center-tap 9 is connected to a full-wave rectifier 34 consisting of diodes 35 and 37. The two diodes alternately supply rectified current to a next stage. The next stage is filtering means consisting of a capacitor 39 and a resistor 41. The capacitance of the capacitor 39 is selected to be relatively small, for instance, 1 microfarad, and the resistor 41, for instance, 5.6 kilohms, so that the time constant thereof is 5.6 milliseconds. Therefore, it is concluded that the rectified and filtered voltage would decrease rapidly in its value upon opening the power switch 3. Thus filtered voltage includes, as natural result, a number of ripple variations therein due to the short time constant as roughly shown by character A in FIG. 2, so that it must be flattened by suitable means before being fed to a next stage. To this end, there is employed in the present embodiment a peak clipper or peak limiter which consists of a resistor 43 and a zener diode 45 coupled in series relationship. The clipper operates in such a manner as to prevent positive amplitude of the wave from ever exceeding a value set thereby. The clipped voltage is illustrated in FIG. 3, wherein the filtered voltage having a waveform denoted by character A in FIG. 2 is clipped by the voltage indicated by character B. In this embodiment, the zener diode can be replaced by an another suitable voltage limiting element. Following, the clipped voltage is fed to the base 49*b* of a transistor 49 through a base resistor 47 such that it remains conductive. The collector 49*c* of the transistor 49 is connected by way of a collector resistor 51 to the bus line 27, and also connected directly to the base 53*b* of the transistor 53. So long as the power switch is closed, the clipped voltage is constantly fed to the base 49*b*, as a result of the fact that the potential of the base 53*b* is nearly equal to zero because the transistor 49 is conductive. Therefore, the transistor 53 is in the state of being non-conductive during the closed time of the power switch 3, which means that the potential at the base 29*b* is maintained at the preset one as mentioned above in detail. Now, let it be assumed that the power switch 3 is caused to open, then the voltage being filtered by the capacitor 39 and the resistor 41 is rapidly reduced by its value, and it is the same statement for the clipped voltage being fed to the base 49*b* of the transistor 49. Therefore, the transistor 49 is rendered non-conductive because of insufficient potential of the base thereof, which operation affects to the following transistor 53 in such a manner as to render it conductive by feeding suitable base potential, then the base 29*b* is virtually forced to be connected to ground, thus resulting in making quickly non-conductive the transistor 29. It is to be noted in this connection that the voltage appearing on the bus line 27 decreases slowly due to the large transition time as mentioned above. Consequently, the relay 25 breaks rapidly the connection between the power amplifier 61 and the loudspeaker 65 by being de-energized.

The present invention have been explained in connection with the circuit having the transformer. However, it is to be noted that the transformer 5 is not necessarily needed to lower a-c power voltage to a desired value and therefore the invention is not restricted to the FIG. 1 circuit with the transformer 5. When employed is the circuit with no transformer, the full-wave rectifiers, 10 and 34, should be replaced with half-wave rectifiers, respectively.

Figure 4:
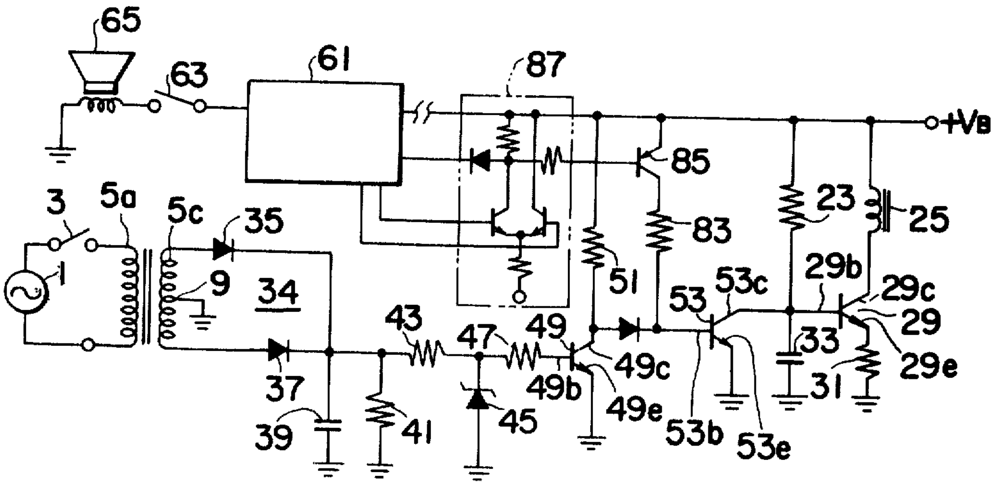
FIG. 4 is an another circuit diagram of the switching circuit in accordance with the present invention, wherein the FIG. 1 circuit is modified so as to be employed with an undesirable condition detecting circuit.

In FIG. 4, there is illustrated a modification of the FIG. 1 circuit, wherein like parts are identified by the same reference characters and the explanation of the operations thereof will be omitted for the sake of simplicity.

According to the circuit arrangement of FIG. 4, the switching circuit described in connection with FIGS. 1 through 3 can be combined, by adding a few parts thereto, with detecting means responsive to unwanted occurrence in the direct-coupled amplifier with no output condenser, such as unbalanced direct voltages appearing therein. The differential amplifier 87 is connected to and derives the unbalanced voltage from the amplifier 61, and then derives its output proportional to the voltage to the base of a transistor 85, which in turn is rendered conductive on the condition that the supplied voltage thereto exceeds a predetermined value. The base 53*b* of the transistor 53 is connected through a resistor 83 and the transistor 85 to the bus line 27, while the cathode of a diode 81 is also connected to the base 53*b* and the anode thereof to the collector 49*c*, so that the potential of the base 53*b* can be elevated to the above-mentioned preset value sufficient to render conductive the transistor 53 because the diode 81 serves to prevent the collector current of the transistor 85 from flowing into the collector 49*c*. As described in connection with FIG. 1, the transistor 53 remains non-conductive while the power switch 3 is closed with the result that the relay 29 is energized to make complete the connection between the power amplifier 61 and the loudspeaker 65. However, it is understood from the above that the occurrence of the unbalance voltage in the direct-coupled power amplifier causes the connection to break instantly even while the power switch 3 is closed, so that the loudspeaker 65 can be protected against excessive direct current flowing therethrough. Furthermore, the current-blocking diode 81 is arranged as described above, the FIG. 4 circuit can achieve the same operation as the embodiment of FIG. 1 upon opening the power switch 3.

The present invention has been described in connection with certain preferred embodiment however, it is appreciated that various changes may be made in the various components and circuits without departing from the intended spirit and scope of the present invention as defined by the appended claims.

What is claimed is:

1. In combination with a power amplifier having a loudspeaker, an a-c power source connected for supplying power to said power amplifier, including a power switch, a switching circuit for breaking a connection between a power amplifier and a loudspeaker upon cutting off an a-c power source by opening said power switch, which includes:

first rectifying means provided for converting a-c voltage received from said power source to a first rectified d-c voltage, first filtering means connected to said first rectifying means and deriving said first rectified voltage therefrom for smoothing ripple variations thereof, to develop a first smoothed voltage, means supplying the first smoothed voltage to said power amplifier, a relay control transistor connected to said first filtering means and supplied with a first preset potential therefrom to maintain the relay control transistor conductive when said power switch is closed, a relay connected to said relay control transistor controlled to make the connection when the relay control transistor remains conductive, the transition time being considerable for said first smoothed voltage to decrease below said first preset potential upon cutting off said a-c power source, the improvement comprising:

switching means connected to said relay control transistor, said switching means including a circuit having means with a considerably short time constant in comparison with said transition time upon cutting off said a-c power source by opening of said power switch, said switching means having means controlling said first preset potential to maintain it constant while said power switch is closed and to rapidly reduce said first preset potential upon cutting off said a-c power source, which is achieved by said short time constant, including means rendering said relay control transistor non-conductive to rapidly break said connection between said amplifier and said loudspeaker by de-energizing of said relay.

2. The combination claimed in claim 1, wherein said switching means further comprises:

second rectifying means for converting the a-c voltage received from said power source to a second rectified d-c voltage, second filtering means connected to said second rectifying means and deriving the second rectified voltage therefrom for smoothing ripple variations thereof, said second filtering means including said circuit with said short time constant, clipping means connected to and derived from said second filtering means the second smoothed voltage for flattening it by clipping a voltage portion in excess of a present value, control means connected to said clipping means for deriving the clipped voltage, means connecting said control means to said relay control transistor and controlling said first preset potential such that said relay control transistor remains conductive only when said clipped voltage is supplied to said control means.

3. The combination claimed in claim 2, wherein said second filtering means consists of a resistor-capacitor circuit.

4. The combination claimed in claim 2, wherein said clipping means consists of a resistor and a voltage limiting element.

5. The combination claimed in claim 2, wherein said control means comprises:

a first transistor and a second transistor, means connecting the base of said first transistor to said clipping means, means connecting the collector thereof to the base of said second transistor, and means connecting the collector of said second transistor to said base of said relay control transistor.

6. The combination claimed in claim 5, including a bus line and said switching means further comprises:

a sensing transistor, detecting means, a diode connected between the collector of said first transistor and the base of said second transistor for preventing a current flowing from said sensing transistor to said collector of said first transistor, means connecting said sensing transistor between said diode and the bus line extending from said first filtering means and base therefore connected to said detecting means in order to derive its output, said sensing transistor being rendered conductive upon said output exceeding a predetermined potential.

* * * * *